United States Patent [19]

Masuoka

[11] 4,223,333
[45] Sep. 16, 1980

[54] CHARGE PUMPING SEMICONDUCTOR MEMORY

[75] Inventor: Fujio Masuoka, Yokohama, Japan

[73] Assignee: Tokyo Shibaura Denki Kabushiki Kaisha, Kawasaki, Japan

[21] Appl. No.: 945,347

[22] Filed: Sep. 25, 1978

[30] Foreign Application Priority Data

Sep. 30, 1977 [JP] Japan .............................. 52-117524

[51] Int. Cl.$^3$ ..................... H01L 27/02; H01L 29/04; H03K 5/00; G11C 11/34
[52] U.S. Cl. .......................................... 357/41; 357/54; 357/59; 307/238; 365/154
[58] Field of Search ..................... 357/41; 307/238; 365/154

[56] References Cited

U.S. PATENT DOCUMENTS

| | | | |
|---|---|---|---|
| 3,662,356 | 5/1972 | Michon et al. | 357/41 |
| 4,091,460 | 5/1978 | Schuermeyer et al. | 365/154 |
| 4,125,854 | 11/1978 | McKenny et al. | 357/41 |

OTHER PUBLICATIONS

Burke et al., "Charge Pump Random-Access Memory", IEEE Int. Solid-State Circuits Conf., (2/72), Dig. Tech. Papers, pp. 16–17.
Ebel et al., "A 4096-Bit High-Speed Emitter-Coupled-Logic (ECL) Compatible Random Access Memory", IEEE J. Solid-State Circuits, vol. 5C-10 (10/75) pp. 262–267.
Iizuka et al., "Electrically Alterable Avalanche-Injection-Type MOS Read-Only Memory With Stacked Gate Structure", IEEE Trans. Electron Devices vol. ED-23 (4/76), pp. 379–387.

Primary Examiner—Gene M. Munson
Attorney, Agent, or Firm—Oblon, Fisher, Spivak, McClelland & Maier

[57] ABSTRACT

There is provided a semiconductor memory apparatus comprising a plurality of memory cells collectively integrated on the same chip in a matrix array and each formed of a flip-flop circuit including a pair of driver MOS transistors, a pair of load MOS capacitors connected to the respective paired driver MOS transistors and address-selection MOS transistors connected to both output terminals of the flip-flop circuit. The memory cells arranged in a row direction are of the same pattern, the adjacent memory cells arranged in a column direction are made symmetrical with each other, the source of one of the paired driver MOS transistors of a given memory cell is connected to the source of the corresponding one of the paired driver MOS transistors of another memory cell disposed adjacent to the first-mentioned memory cell in a row direction, the gates of the driver MOS transistors and address-selection MOS transistors are formed by selectively etching a first polycrystalline silicon layer, and the paired MOS capacitors are constituted by a second polycrystalline layer mounted through an insulation layer over the respective drain regions of the paired driver MOS transistor.

12 Claims, 11 Drawing Figures

CHARGE PUMPING SEMICONDUCTOR MEMORY

BACKGROUND OF THE INVENTION

This invention relates to integrated semiconductor memory cells, in each of which a charge pump is formed of a MOS capacitor acting as a load element for the flip-flop circuit of the memory cell.

There is set forth in a publication issued by the "IEEE International Solid State Circuits Conference" (Feb. 16, 1972, pages 16, 17) a static RAM including memory cells each utilizing a charge pump constituted by a MOS capacitor instead of a MOS transistor to act as a load element for the flip-flop circuit of the memory cell. FIG. 1 shows an equivalent circuit of this static memory cell. The memory cell of FIG. 1 is provided with a flip-flop circuit including a pair of driver MOS transistors Q1 and Q2 whose sources are connected together; a load MOS capacitor C1, one of whose electrodes is connected to the drain of the driver MOS transistor Q1 and the gate of the driver MOS transistor Q2; and a load MOS capacitor C2, one of whose electrodes is connected to the drain of the driver MOS transistor Q2 and the gate of the driver MOS transistor Q1. A clock pulse having a prescribed frequency is supplied to the other electrodes of the load MOS capacitors C1 and C2 to cause them to act as charge pumps. The output terminals Q and $\bar{Q}$ of the flip-flop circuit are connected to digit lines D and $\bar{D}$ through the coresponding address-selection MOS transistors Q3 and Q4. The gates of these transistors Q3 and Q4 are jointly connected to a word line W.

The disclosed memory cell in which a charge pump is used as a load element for a flip-flop circuit has a noticeable merit of reducing an area occupied by the memory cell. Various attempts have been proposed to decrease the area of the memory cell.

SUMMARY OF THE INVENTION

It is accordingly an object of this invention to provide integrated semiconductor memory cells whose areas are minimized as much as possible.

Another object is to provide an integrated semiconductor memory apparatus formed of a plurality of memory cells whose areas are reduced to the greatest possible extent and which are arranged in a matrix array.

According to an aspect of the invention there is provided an integrated semiconductor memory cell which comprises a semiconductor substrate of one conductivity type; first to eighth semiconductor regions of the opposite conductivity type on the surface of the semiconductor substrate; a first polycrystalline silicon layer including first gate means insulatively disposed at least in part above said first and second semiconductor regions to control electrical current flowing between said first and second semiconductor regions, second gate means insulatively disposed at least in part above said third and fourth semiconductor regions to control electrical current flowing between said third and fourth semiconductor regions and third gate means insulatively disposed at least in part above said fifth to eighth semiconductor regions to control electrical current flowing between said fifth and sixth semiconductor rigions and at the same time control electrical current flowing between said seventh and eighth semiconductor regions; a second polycrystalline silicon layer including first capacitive means insulatively disposed above that part of said semiconductor substrate which lies adjacent to said first semiconductor region and second capacitive means insulatively disposed above that part of said semiconductor substrate which lies adjacent to said third semiconductor region; first coupling means for electrically coupling said first and fifth semiconductor regions to said second gate means; and second coupling means for electrically coupling said third and seventh semiconductor regions to said first gate means, and wherein said first and second semiconductor regions and said first gate means constitute a first driver transistor; said third and fourth semiconductor regions and said second gate means constitute a second driver transistor; that part of the semiconductor substrate which lies adjacent to said first semiconductor region and said first capacitive means constitute a first load capacitor; and that part of the semiconductor substrate which is positioned adjacent to said third semiconductor region and said second capacitive means constitute a second load capacitor.

DETAILED DESCRIPTION OF THE INVENTION

There will now be described by reference to FIGS. 2 to 7 a semiconductor memory apparatus according to one embodiment of this invention. FIGS. 2 to 7 show the sequential steps of manufacturing a semiconductor memory apparatus having a matrix array of semiconductor memory cells each formed of n-type MOS transistors arranged on a p-type semiconductor substrate. Throughout FIGS. 2 to 7, a region enclosed in dot-dash lines denotes that allotted to one memory cell. As apparent from FIGS. 2 to 7, memory cells arranged in the same row are of the same patterns in a row direction and are made symmetrical with those arranged in the adjacent rows.

Figure 1:
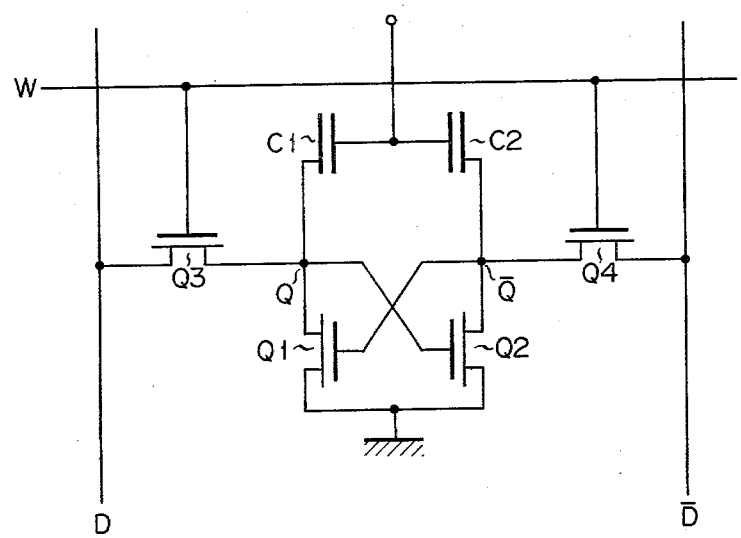
FIG. 1 is a circuit diagram of a static memory cell having charge pumps formed of MOS transistors and acting as load elements for a flip-flop circuit.

A silicon oxide ($SiO_2$) layer is formed on the field region of the p-type silicon substrate with a thickness of about 8000 Å. Another silicon oxide ($SiO_2$) layer is formed on the element area of the substrate with a thickness of about 1000 Å, providing a semiconductor structure of FIG. 2. The term "element area," as used herein, is defined to include, as later described, an area 10 where the source, drain and channel regions of the MOS transistors Q1 and Q3 used to constitute a memory cell which is the same as that of FIG. 1, and the MOS capacitor C1 is formed, an area 12 where there are formed the source, drain and channel regions of the MOS transistor Q2 and MOS capacitor C2, and an area 14 where the source, drain and channel regions of the MOS transistor Q4 are formed.

Figure 2:
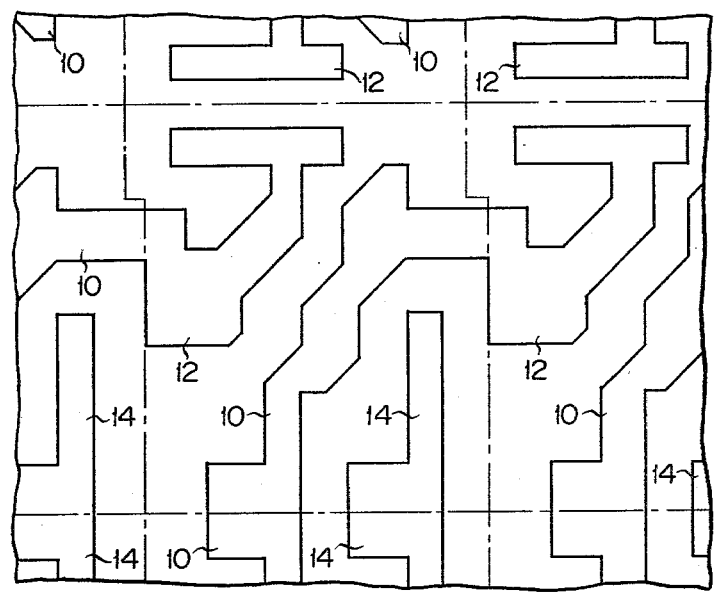
FIGS. 2 to 7 are plan views of part of a semiconductor memory structures for illustrating sequential steps of forming a semiconductor memory apparatus according to one embodiment of this invention.

The semiconductor structure of FIG. 2 is constructed by depositing a silicon oxide layer all over, for example, the substrate with a thickness of about 8000 Å and etching an area corresponding to the element area to a thickness of about 1000 Å, or depositing a silicon oxide layer all over the substrate with a thickness of about 1000 Å, and threafter laminating a silicon oxide layer on an area corresponding to the field region.

Figure 3:
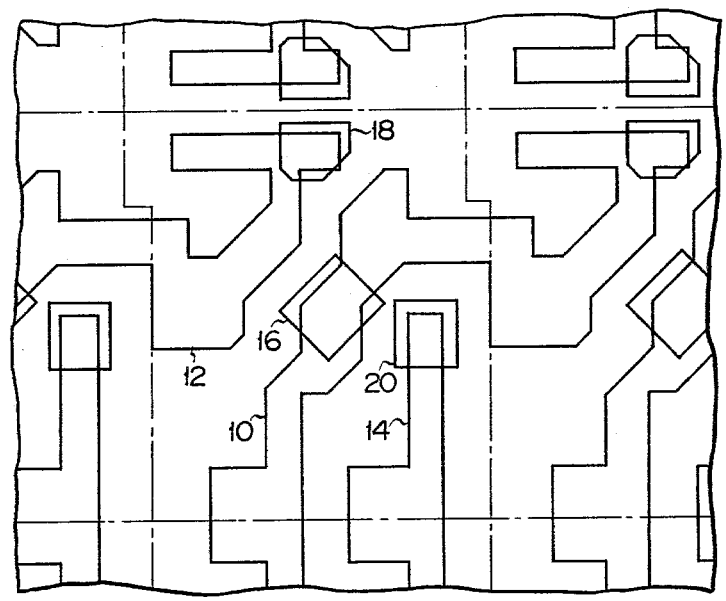

Later, as shown in FIG. 3, areas 16, 18 and 20 are selectively etched to remove part of a thin silicon oxide layer previously formed and partly expose the underlying substrate surface. Then, a first polycrystalline silicon layer is formed with a thickness of about 3000 Å by, for example, gas phase growth all over the same conductor structure of FIG. 3. The first polycrystalline silicon layer is doped with an impurity such as phosphorus or arsenic during or after the gas phase growth. The impurity is diffused in that portion of the surface of the semiconductor substrate which was exposed by the step of FIG. 3, thereby electrically connecting together the first polycrystalline silicon layer and the semiconductor substrate. The first polycrystalline silicon layer is selectively etched to provide patterned regions 22, 24 and 26 indicated in FIG. 4. One end portion 221 of the patterned region 22 contacts that portion of the semiconductor substrate surface which is exposed in the region 16 (FIG. 3). The patterned region 22 extends across the region 12 to constitute a gate electrode 222 of the MOS transistor Q2. Both end portions 241 and 242 of the patterned region 24 contact those portions of the semiconductor substrate surface which are exposed in the regions 18 and 20, respectively. The patterned region 24 extends across the region 10 to form a gate electrode 243 of the MOS transistor Q1. The patterned region 26 extends across the regions 10 and 14 in the row direction to constitute gate electrodes 261 and 262 of the MOS transistors Q3 and Q4 and also the word line W the same as that of FIG. 1.

Figure 4:
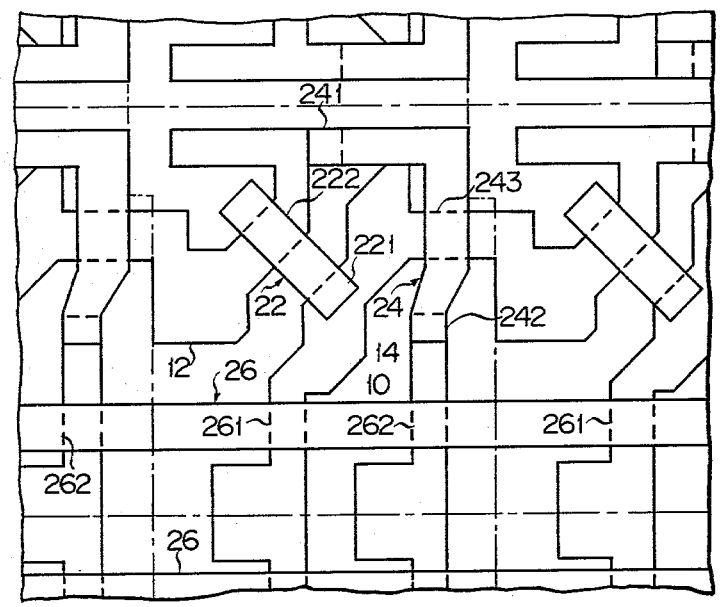
Figure 5:
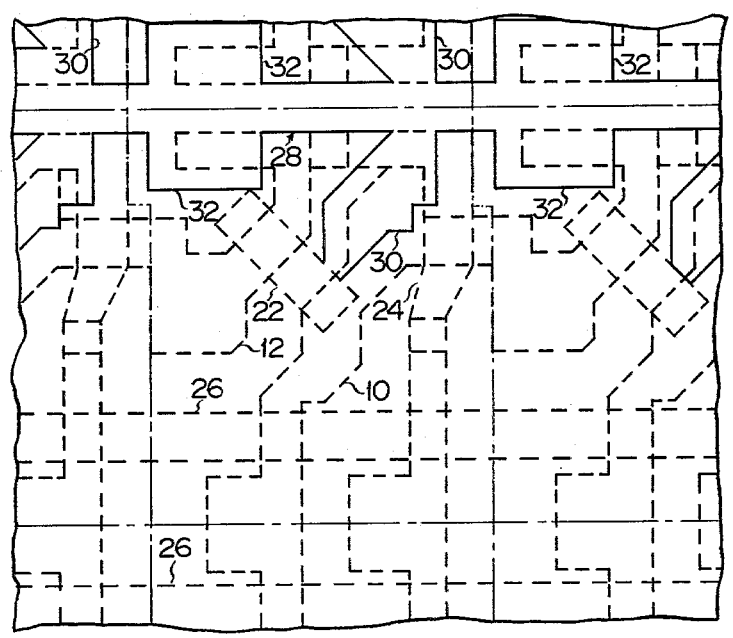

A silicon oxide (SiO$_2$) layer is formed with a thickness of about 1000 Å by thermal oxidation on the surface of the semiconductor structure of FIG. 4. Then, a second polycrystalline silicon layer is deposited on the silicon oxide (SiO$_2$) layer with a thickness of about 3000 Å. This polycrystalline silicon layer is patterned as shown in FIG. 5. The patterned polycrystalline silicon layers 28 of the respective memory cells are formed along the border lines between the adjacent rows. The respective memory cells lying in the adjacent rows include capacitive regions 30 insulatively formed on part of the region 10, individually to form one of the electrodes of the capacitor C1 (FIG. 1) of the memory cells and other capacitive regions 32 insulatively mounted on part of the region 12 individually to constitute one of the electrodes of the capacitor C2. Where a 2N number of memory cells are arranged in a column direction, then an N number of second polycrystalline silicon layers 28 are formed.

Figure 6:
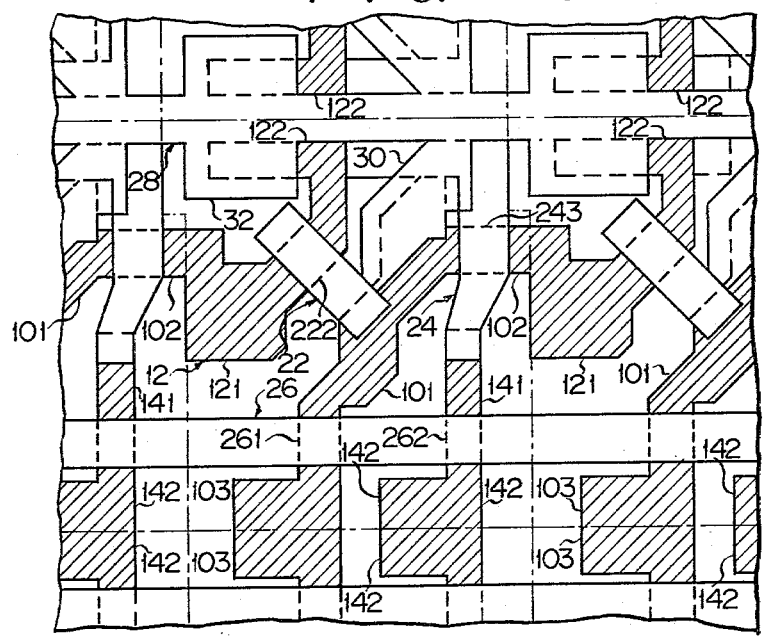
Figure 7:
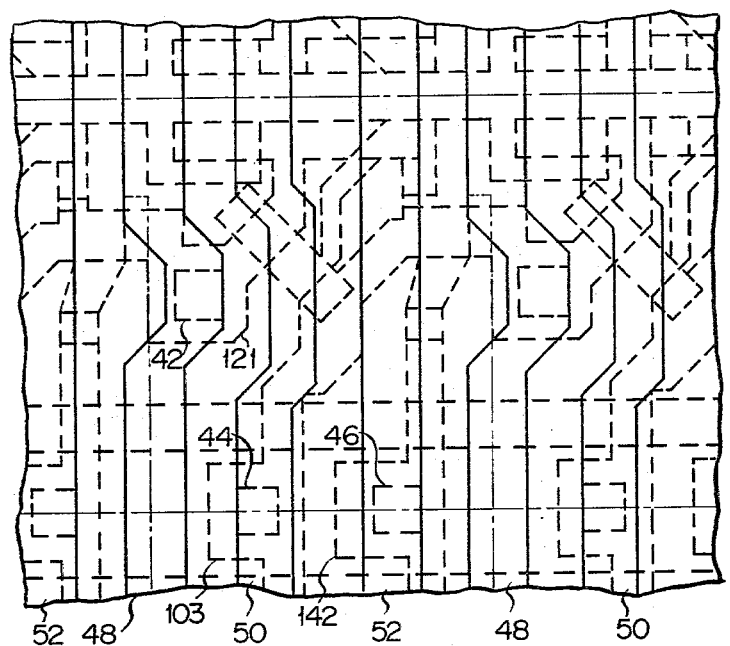

The exposed portion of a thin silicon oxide layer formed with a thickness of about 1000 to 2000 Å on the semiconductor structure of FIG. 5 is etched out with the polycrystalline silicon layer used as a mask to selectively expose part of the upper surface of the semiconductor structure, as shown in FIG. 6. An impurity such as phosphorus or arsenic is diffused in the exposed portions of the semiconductor substrate surface to form the source and drain regions of the MOS transistors. In FIG. 6, these source and drain regions are indicated in hatching to be readily observed. In this case, the above-mentioned impurity is also diffused in the second polycrystalline silicon layer 28 to reduce its resistance.

As seen from FIG. 6, the drain and source regions of the MOS transistor Q1 are constituted by n+ regions 101 and 102. The gate electrode of the MOS transistor Q1 is formed of the gate region 243 of the first polycrystalline silicon layer 24. The source and drain regions of the MOS transistor Q2 are formed of n+ regions 121 and 122, respectively. The gate electrode of the MOS transistor Q2 is formed of the gate region 222 of the first polycrystalline silicon layer 22. The drain and source regions of the MOS transistor Q3 are respectively formed of n+ regions 101 and 103. The gate electrode of the MOS transistor Q3 is constituted by the gate region 261 of the first polycrystalline layer 26. The drain and source regions of the MOS transistor Q4 are respectively formed of n+ regions 141 and 142. The gate electrode of the MOS transistor Q4 is constituted by the gate region 262 of the first polycrystalline silicon layer 26. The MOS capacitor C1 is formed of the capacitor region 30 of the second polycrystalline silicon layer 28 and an inversion layer formed by voltage impressed on the capacitor region 30 on that portion of the semiconductor substrate surface which corresponds to the capacitor region 30. The MOS capacitor C2 is canstituted by the capacitor region 32 of the second polycrystalline silicon layer 28 and an inversion layer formed by voltage impressed on the capacitor region 32 on that portion of the semiconductor substrate surface which corresponds to the capacitor region 32.

A silicon oxide (SiO$_2$) layer is deposited on the surface of the semiconductor structure of FIG. 6. Those portions of the silicon oxide (SiO$_2$) layer which correspond to the source region 121 of the MOS transistor Q2 and the source regions 103 and 142 of the MOS transistors Q3 and Q4 are bored with contact holes 42, 44 and 46. Aluminium layers 48 are formed in the column direction each of which is electrically connected to the source regions 121 of the MOS transistors Q2 arranged in the same column through the contact holes of the respective memory cells. The source region 102 of the MOS transistor Q1 of a given memory cell is electrically connected to the source region 121 of the MOS transistor Q2 of the adjacent memory cell. Accordingly, these source regions 102 and 121 can be jointly connected to a reference potential terminal (not shown) by means of the aluminium layer 48. Aluminium layers 50 are formed in the column direction each of which is electrically connected through the contact holes 44 to the source regions 103 of the MOS transistors Q3 of the memory cells arranged on the same column. Similarly, aluminium layers 52 are formed in the column direction each of which is electrically connected through the contact holes 46 to the source regions 142 of the MOS transistors Q4 of the memory cells arranged in the same column. These aluminium layers 50 and 52 are used as digit lines D and $\overline{D}$ for the memory cells arranged in the same column.

According to the embodiment of this invention, the source regions 102 and 121 of the MOS transistors Q1 and Q2 of each memory cell are not separately connected to a reference potential terminal. Instead, the source region 102 of the MOS transistor Q1 of a memory cell set in a given column and the source region 121 of the MOS transistor Q2 of a memory cell belonging to the adjacent column are jointly connected to a reference power source terminal by a single aluminium layer 48 extending in a column direction. The electrodes of the MOS capacitors C1 and C2 of the memory cells of the adjacent rows are constituted by a single second polycrystalline silicon layer 28 expending in the row direction. The above-mentioned arrangement reduces an area occupied by each memory cell to 29 microns×34 microns, and enables the size of a memory chip having a capacity of 16K bits to fall within an outline measuring 5 mm×5 mm.

Figure 8:
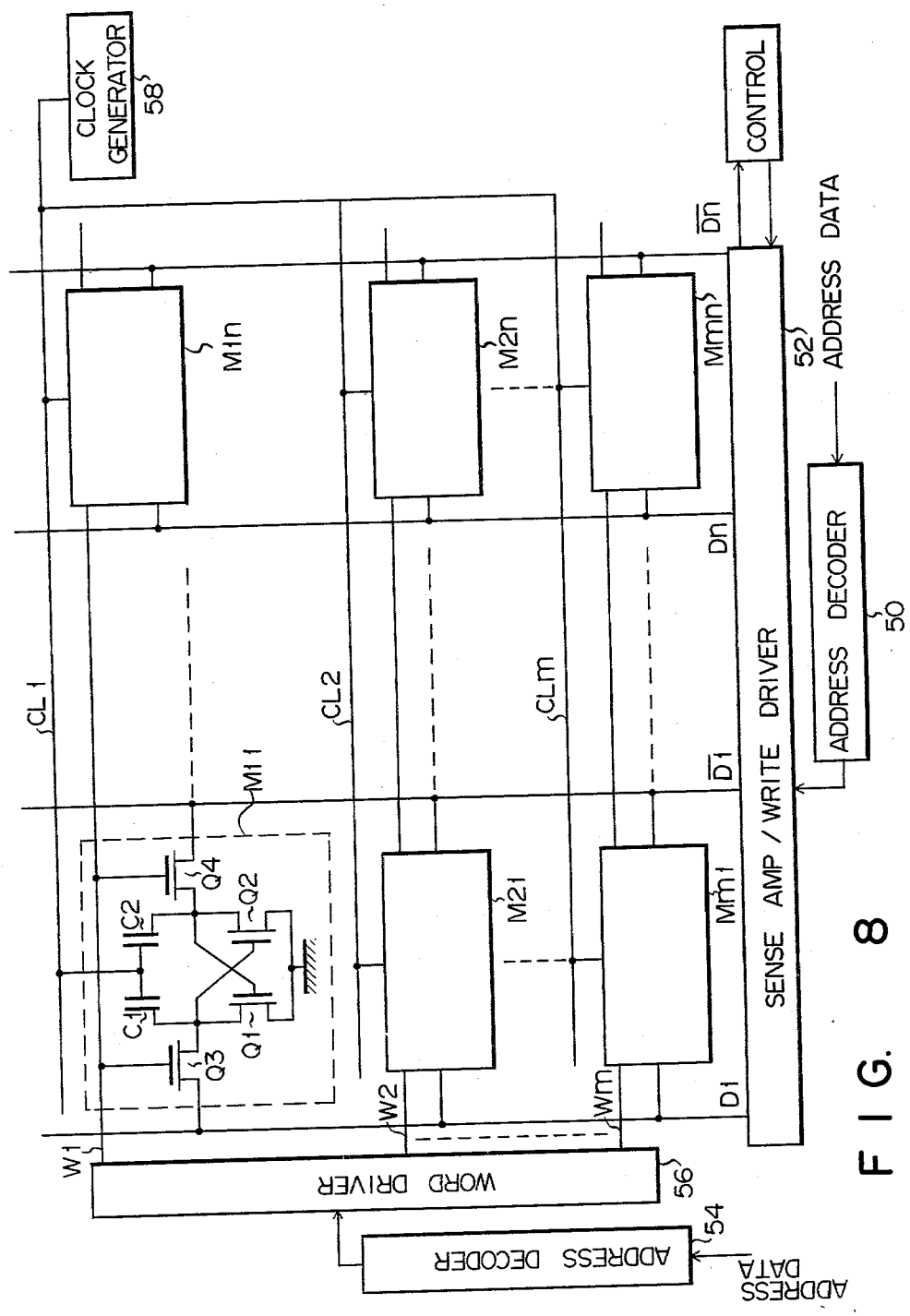
FIG. 8 is a block diagram of a semiconductor memory circuit according to one embodiment of this invention.

FIG. 8 is a block circuit diagram of a memory apparatus including a plurality of memory cells each constructed as described above and arranged in a matrix array. The memory apparatus of FIG. 8 is manufactured by the steps described by reference to FIGS. 2 to 7, and has memory cells arranged in a matrix array of an m number of rows and an n number of columns. The digit lines D and $\overline{D}$ are selectively energized by an address decoder 50 operated upon receipt of an address signal from a control unit (not shown) and a sense amplifier/write driver 52. Data is read out of or written in the memory cell by means of the energized one of the digit lines D and $\overline{D}$. The word line W operated in response to an address signal supplied from a control unit (not shown) is selectively energized by an address decoder 54 and word driver 56 to designate a particular one of the memory cells arranged in a given column. The clock lines CL of the MOS capacitors C1 and C2 of the memory cells are jointly connected to a clock pulse generator 58. The address decoders 50 and 54, sense amplifier/write driver 52 and word driver 56 used with the memory apparatus of this invention are of the generally known type, description thereof being omitted.

Figure 9:
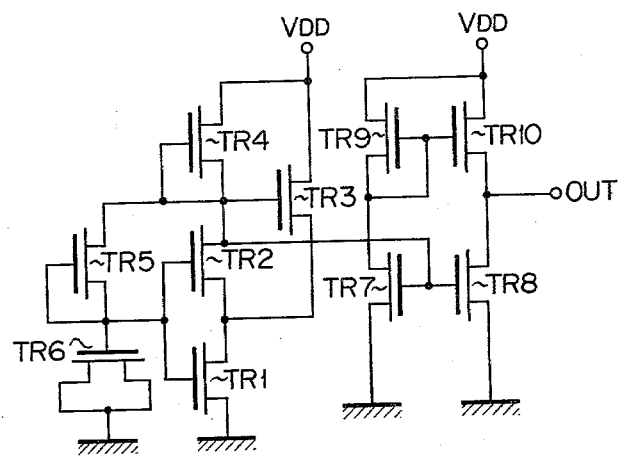
FIG. 9 is a circuit diagram of a clock pulse generator used in the semiconductor memory circuit of FIG. 8.

FIG. 9 shows the circuit arrangement of the clock pulse generator 58 used with the memory apparatus of FIG. 8. This clock pulse generator 58 is provided with a CR oscillator which includes an inverter formed of an E-type (enhancement) MOS transistors TR1 and TR2 whose current paths are connected in series, an E-type MOS transistor TR3 whose drain and gate are respectively connected to the source and drain of the E-type MOS transistor TR2 and a D-type (depletion) MOS transistor TR4 whose drain is connected to the drain of the E-type MOS transistor TR3 and whose source and gate are jointly connected to the gate of the E-tpe MOS transistor TR3. The CR oscillator also includes a CR time constant circuit formed of a D-type MOS transistor TR5 (acting as a resistor) whose drain is connected to the gate of the E-type MOS transistor TR3 and whose gate and source are jointly connected to the gate of the MOS transistor TR1 and that of the E-type MOS transistor TR2 and a D-type MOS transistor TR6 whose gate is connected to the source of the D-type MOS transistor TR5 and whose source and drain are grounded. The output terminal of the CR oscillator is connected to the gates of E-type MOS transistors TR7 and TR8 whose source are grounded. These E-type MOS transistors TR7 and TR8 and a D-type MOS transistor TR9 whose source and gate are jointly connected to the drain of the E-type MOS transistor TR7, and a D-type MOS transistor TR10 whose gate and source are respectively connected to the drains of the E-type MOS transistors TR7 and TR8 all collectively constitute a clock pulse-generating driver circuit for issuing a clock pulse in response to an output signal from the CR oscillator. The clock pulse generator can be driven by a single power source and therefore it can be integrated with memory cells on the same chip, making it unnecessary to provide any external terminal for supplying a clock pulse. Therefore, the memory cells can be handled in exactly the same manner as the prior art memory cells using E/D flip-flop circuits operated by a single power source or memory cells using E/R flip-flop circuit similarly operated by a single power source. Where the clock pulse generator is integrated with memory cells on the same chip the contents of the memory cells can be preserved simply by supplying current to the clock pules generator even when other peripheral circuits do not receive power.

Figure 10:
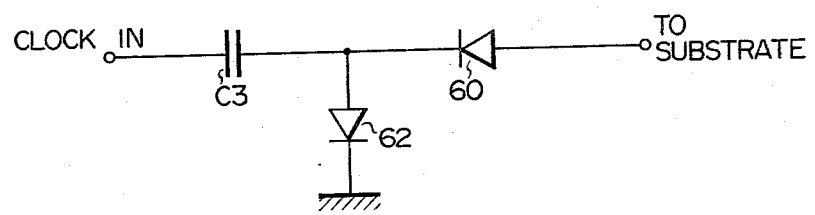
FIGS. 10 and 11 show self-back-gate-bias circuits which can be used in the semiconductor memory circuit of FIG. 8.
Figure 11:
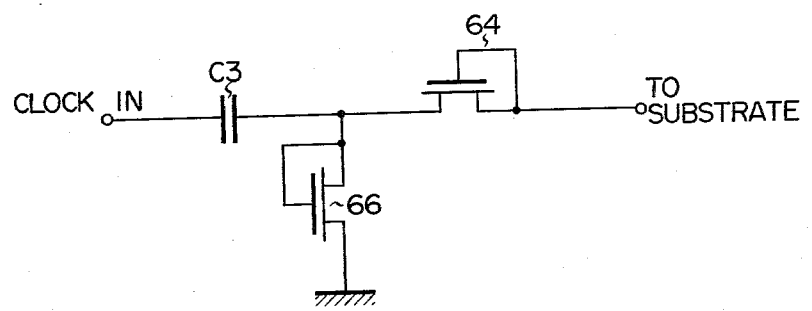

FIGS. 10 and 11 indicate self-back-gate-bias circuits designed to transfer electric charges to the substrate of memory cells upon receipt of a clock pulse from the clock pulse generator 58 to impress its own self-back-gate-bias voltage on the memory cells. The self-back-gate-bias circuit of FIG. 10 includes a MOS capacitor C3 connected at one end to the output terminal of the clock pulse generator, a diode 60 connected between the other end of the MOS capacitor and the memory cell substrate, and a diode 62 connected between the other terminal of the MOS capacitor C3 and a reference potential point. When a clock pulse is supplied to one end of the MOS capacitor C3, an electric charge at the reference potential point is pumped to the memory cell substrate. This arrangement accelerates the response of memory cells and saves power consumption.

The self-back-gate-bias circuit of FIG. 11 is of the same type as that of FIG. 10 except that the diodes 60 and 62 are replaced by a MOS transistor 64 whose drain is connected to the other end of the MOS capacitor C3 and whose gate and source are connected to the memory cell substrate and a MOS transistor 66 whose gate and drain are connected to the other end of the MOS capacitor C3 and whose source is connected to the reference potential point.

What is claimed is:
1. A semiconductor memory cell comprising:
a semiconductor substrate of one conductivity type;
first to eighth semiconductor regions of opposite conductivity type formed in the surface region of said semiconductor substrate;
gate means formed of polycrystalline silicon and including a first gate electrode insulatively disposed at least in part above said first and second semiconductor regions to control electrical current flowing between said first and second semiconductor regions, a second gate electrode insulatively disposed at least in part above said third and fourth semiconductor regions to control electrical current flowing between said third and fourth semiconductor regions, and a third gate electrode insulatively disposed at least in part above said fifth to eighth semiconductor regions to control electrical current flowing between said fifth and sixth semiconductor regions and at the same time control electrical current flowing between said seventh and eighth semiconductor regions;
first and second capacitor electrodes formed of a polycrystalline silicon layer, said first capacitor electrode being insulatively disposed above a first part of said semiconductor substrate which lies adjacent to said first semiconductor region, and said second capacitor electrode being insulatively disposed above a second part of said semiconduc- tor substrate which lies adjacent to said third semiconductor region;
first coupling means for electrically coupling said first and fifth semiconductor regions to said second gate electrode; and
second coupling means for electrically coupling said third and seventh semiconductor regions to said first gate electrode;
wherein said first and second semiconductor regions and said first gate electrode constitute a first driver transistor; said third and fourth semiconductor regions and said second gate electrode constitute a second driver transistor; said fifth and sixth semiconductor regions and said third gate electrode constitute a first address selection transistor; said seventh and eighth semiconductor regions and said third gate electrode consitute a second address selection transistor; said first part of the semiconductor substrate and said first capacitor electrode constitute a first load capacitor; and said second part of the semiconductor substrate and said second capacitor electrode constitute a second load capacitor and said first gate electrode and said first capacitor electrode are disposed to overlap each other lnsulatively and at least partly.

2. A semiconductor memory cell according to claim 1, wherein said first conductivity type is a p-type.

3. A semiconductor memory cell according to claim 1 or 2, wherein said first and fifth semiconductor regions and said first coupling means are formed of a same semiconductor material.

4. A semiconductor memory cell according to claim 1 or 2, wherein said second coupling means includes a first coupling semiconductor region formed as part of said third semiconductor region and a second coupling semiconductor region formed as part of said seventh semiconductor region.

5. A semiconductor memory apparatus comprising:
a plurality of memory cells arranged in a matrix array and each including
first to eighth semiconductor regions of opposite conductivity type formed in the surface region of said semiconductor substrate,
gate means formed of polycrystalline silicon and including first gate electrode insulatively disposed at least in part above said first and second semiconductor regions to control electrical current flowing between said first and second semiconductor regions, second gate electrode insulatively disposed at least in part above said third and fourth semiconductor regions to control electrical current flowing between said third and fourth semiconductor regions and third gate electrode insulatively disposed at least in part above said fifth to eighth semiconductor regions to control electrical current flowing between said fifth and sixth semiconductor regions and at the same time control electrical current flowing between said seventh and eighth semiconductor regions,
first and second capacitor electrodes formed of a polycrystalline silicon layer, said first capacitor electrode being insulatively disposed above a first part of said semiconductor substrate which lies adjacent to said first semiconductor region and said second capacitor electrode being insulatively disposed above a second part of said semiconductor substrate which lies adjacent to said third semiconductor region, said first gate electrode and said first capacitor electrode are disposed to overlap each other insulatively and at least partly,
first coupling means for electrically coupling said first and fifth semiconductor regions to said second gate electrode, and
second coupling means for electrically coupling said third and seventh semiconductor regions to said first gate electrode, wherein the memory cells in each row have the same pattern and are formed symmetrical with those in the adjacent row, and said third gate electrodes of the memory cells in the same row are formed of a single polycrystalline silicon layer extending in a row direction;
a plurality of first conductive layers which are arranged in a column direction and each of which electrically connects the second semiconductor regions of the memory cells in a first column and the fourth semiconductor regions of memory cells in one of two columns adjacent to the first column;
a plurality of second conductive layers which are arranged in a column direction and each of which electrically connects the sixth semiconductor regions of memory cells in a column;
a plurality of third conductive layers which are arranged in a column direction and each of which electrically connects the eight semiconductor regions of memory cells in a column;
a word driver circuit connected to the third gate electrodes arranged in each row to selectively energize the third gate electrode;
a sense amplifier and write drive circuit connected to said second and third conductive layers arranged in each column to selectively energize the second and third layers;
control means supplying address signals to said word drive circuit and sense amplifier and write driver circuit to select the row and column; and
clock pulse generating means connected to said first and second capicator electrodes in each memory cell to supply a clock pulse signal to each of said first and second capacitor electrodes.

6. A semiconductor memory apparatus according to claim 5, wherein those of said first and second capacitor electrodes which are formed in each of the memory cells arranged in two adjacent rows are formed of a single polycrystalline silicon layer.

7. A semiconductor memory apparatus according to claim 5, wherein said clock pulse generating means is constituted by a plurality of metal-oxide-semiconductor transistors formed on a chip on which said memory cells are formed.

8. A semiconductor memory apparatus according to claim 5, 6 or 7, further comprising a self-back-gate-bias circuit connected between the output terminal of said clock pulse generating means and said semiconductor substrate to transfer electric charges to said semiconductor substrate.

9. A semiconductor memory apparatus according to claim 8, wherein said self-back-gate-bias circuit includes first and second diodes connected between said semiconductor substrate and a reference potential point; and an metal-oxide-semiconductor capacitor connected between the junction of said first and second diodes and the output terminal of said clock pulse generator.

10. A semiconductor memory apparatus according to claim 8 wherein said self-back-gate-bias circuit includes first and second metal-oxide-semiconductor transistors whose current paths are connected between said semiconductor substrate and a reference potential point, said first metal-oxide-semiconductor transistor having the gate connected to the semiconductor substrate and said second metal-oxide-semiconductor transistor having the gate connected to the drain of said first metal-oxide-semiconductor transistor, and an metal-oxide-semiconductor capacitor connected between the junction of said first and second metal-oxide-semiconductor transistors and the output terminal of said clock pulse generating means.

11. A semiconductor memory apparatus according to claim 5, wherein said first and fifth semiconductor regions and said first coupling means in each memory cell are formed of a semiconductor material.

12. A semiconductor memory apparatus according to claim 5, wherein said second coupling means includes a first coupling semiconductor region formed as part of said third semiconductor region and a second coupling semiconductor region formed as part of said seventh semiconductor region.

* * * * *